(12) United States Patent
Kobayashi et al.

(10) Patent No.: US 12,089,372 B2
(45) Date of Patent: Sep. 10, 2024

(54) OPTO-ELECTRIC MODULE

(71) Applicant: AIO CORE CO., LTD., Tokyo (JP)

(72) Inventors: Shigeru Kobayashi, Tokyo (JP);
Kazuhiro Shiba, Tokyo (JP); Mitsuru Kurihara, Tokyo (JP); Kazuhiko Kurata, Tokyo (JP)

(73) Assignee: AIO CORE CO., LTD., Tokyo (JP)

( * ) Notice: Subject to any disclaimer, the term of this patent is extended or adjusted under 35 U.S.C. 154(b) by 250 days.

(21) Appl. No.: 17/585,042

(22) Filed: Jan. 26, 2022

(65) Prior Publication Data

US 2022/0240410 A1    Jul. 28, 2022

(30) Foreign Application Priority Data

Jan. 28, 2021    (JP) ................................ 2021-012456

(51) Int. Cl.
*H05K 7/20*    (2006.01)
*G02F 1/01*    (2006.01)

(52) U.S. Cl.
CPC ........... *H05K 7/2039* (2013.01); *G02F 1/011* (2013.01)

(58) Field of Classification Search
None
See application file for complete search history.

(56) References Cited

U.S. PATENT DOCUMENTS

| 10,386,586 | B2 * | 8/2019 | Iida .................... | G02B 6/12004 |
| 2005/0135732 | A1 * | 6/2005 | Crow ................... | G02B 6/4232 |
| | | | | 385/33 |

(Continued)

FOREIGN PATENT DOCUMENTS

| JP | 2006-270037 A | 10/2006 |
| WO | WO-2014/156962 A1 | 10/2014 |

(Continued)

OTHER PUBLICATIONS

Notification of Reasons for Refusal issued in Japanese Application No. 2021-012456, dated Feb. 26, 2024.

*Primary Examiner* — Jerry Rahll
(74) *Attorney, Agent, or Firm* — MICHAEL BEST & FRIEDRICH LLP

(57) ABSTRACT

To provide an opto-electric module that can be cooled efficiently. An opto-electric module comprises: an opto-electric hybrid device provided with an electronic circuit and an optical circuit driven by the electronic circuit, the opto-electric hybrid device having a first surface and a second surface on an opposite side from the first surface, such that an electrical input and output unit with respect to the electronic circuit and an optical input and output unit with respect to the optical circuit are disposed on the first surface; an interface substrate which is disposed near the first surface of the opto-electric hybrid device and which is provided with an electrical interconnect coupled to the electrical input and output unit, an optical interconnect coupled to the optical input and output unit, an electrical interface which is connected to the electrical interconnect and also connectible to an external electrical interconnect, and an optical interface which is connected to the optical interconnect and also connectible to an external optical interconnect; and a heat-dissipating member disposed in contact with the second surface of the opto-electric hybrid device.

9 Claims, 4 Drawing Sheets

(56) References Cited

U.S. PATENT DOCUMENTS

| | | | | |
|---|---|---|---|---|
| 2011/0064354 | A1* | 3/2011 | Nishio | G02B 6/4214 |
| | | | | 264/1.25 |
| 2012/0063718 | A1* | 3/2012 | Steijer | G02B 6/4269 |
| | | | | 385/14 |
| 2016/0062063 | A1* | 3/2016 | Ogura | G02B 6/305 |
| | | | | 264/1.27 |
| 2016/0164251 | A1* | 6/2016 | Yashiki | G02F 1/025 |
| | | | | 385/2 |
| 2019/0339450 | A1 | 11/2019 | Noriki et al. | |

FOREIGN PATENT DOCUMENTS

| WO | WO-2015/012213 A1 | 1/2015 |
|---|---|---|
| WO | 2018-083966 A1 | 5/2018 |

* cited by examiner

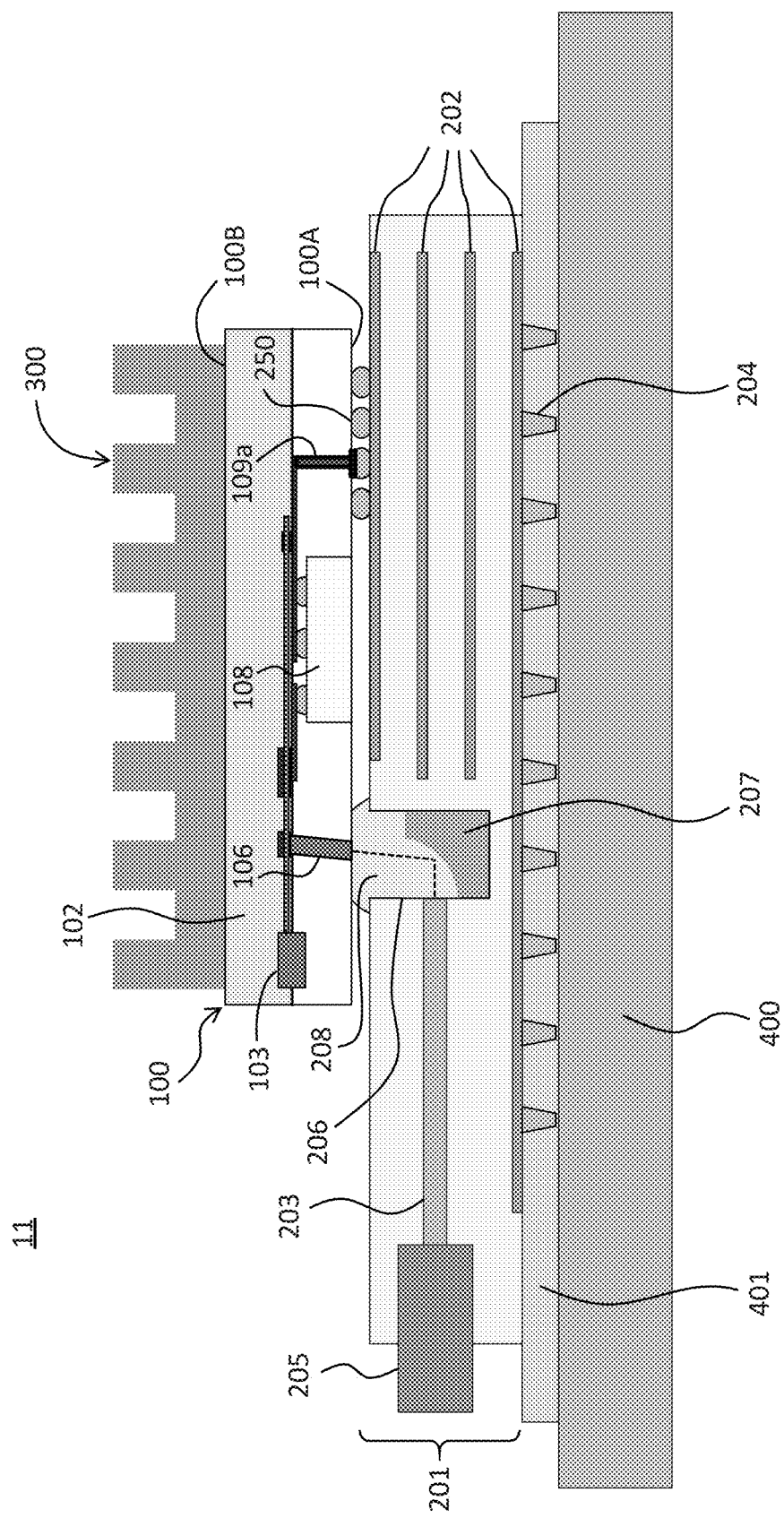

OPTO-ELECTRIC MODULE

TECHNICAL FIELD

The present invention relates to an opto-electric module, and more particularly, to a mounting structure for an opto-electric module.

BACKGROUND ART

In opto-electric modules provided with a large number of electronic components and optical components (for example, see PTL 1 and 2), as the speed of transmission signals increases, the heat generated by each component continues to increase.

CITATION LIST

Patent Literature

PTL 1: International Publication No. WO 2015/012213
PTL 2: International Publication No. WO 2014/156962

SUMMARY OF INVENTION

Technical Problem

The present invention has been devised in the light of the above points, and one objective thereof is to provide an opto-electric module that can be cooled efficiently.

Solution to Problem

To solve the problem described above, one aspect of the present invention is an opto-electric module comprising: an opto-electric hybrid device provided with an electronic circuit and an optical circuit driven by the electronic circuit, the opto-electric hybrid device having a first surface and a second surface on an opposite side from the first surface, such that an electrical input and output unit with respect to the electronic circuit and an optical input and output unit with respect to the optical circuit are disposed on the first surface; an interface substrate which is disposed near the first surface of the opto-electric hybrid device and which is provided with an electrical interconnect coupled to the electrical input and output unit, an optical interconnect coupled to the optical input and output unit, an electrical interface which is connected to the electrical interconnect and also connectible to an external electrical interconnect, and an optical interface which is connected to the optical interconnect and also connectible to an external optical interconnect; and a heat-dissipating member disposed in contact with the second surface of the opto-electric hybrid device.

Also, another aspect of the present invention is an opto-electric module in which, in the above aspect, the second surface of the opto-electric hybrid device is a flat surface with no steps.

Also, another aspect of the present invention is an opto-electric module in which, in the above aspect, the heat-dissipating member contacts the entirety of the flat second surface.

Also, another aspect of the present invention is an opto-electric module in which, in the above aspect, the opto-electric hybrid device is provided with an optical waveguide disposed perpendicularly or obliquely to the first surface, and the optical input and output unit of the opto-electric hybrid device is an end of the optical waveguide near the first surface.

Also, another aspect of the present invention is an opto-electric module in which the above aspect further comprises an optical coupling unit that optically couples the optical input and output unit of the opto-electric hybrid device to the optical interconnect of the interface substrate.

Also, another aspect of the present invention is an opto-electric module in which, in the above aspect, the optical coupling unit is a mirror formed on an end face of the optical interconnect.

Also, another aspect of the present invention is an opto-electric module in which, in the above aspect, the optical coupling unit is a mirror built inside or mounted on the surface of the interface substrate.

Also, another aspect of the present invention is an opto-electric module in which, in the above aspect, the mirror is a condensing mirror.

Also, another aspect of the present invention is an opto-electric module in which, in the above aspect, the optical coupling unit includes a transparent medium of a solid or a gel filling a space between the optical input and output unit of the opto-electric hybrid device and the end face of the optical interconnect of the interface substrate.

Advantageous Effects of Invention

According to the present invention, an opto-electric module can be cooled efficiently.

BRIEF DESCRIPTION OF DRAWINGS

FIG. 4 is a cross section view of an opto-electric module according to another embodiment of the present invention.

DESCRIPTION OF EMBODIMENTS

Hereinafter, embodiments of the present invention will be described in detail and with reference to the drawings.

Figure 1:
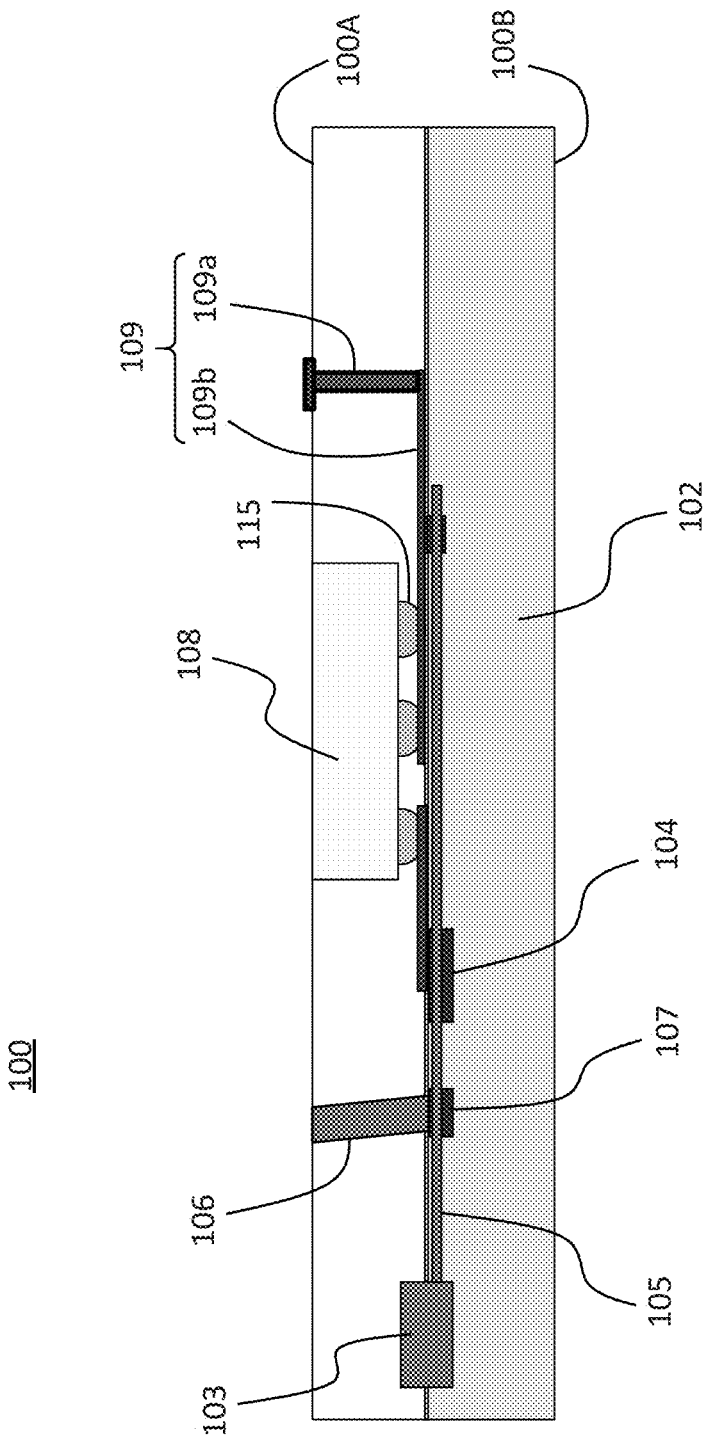
FIG. 1 is a cross section view of an opto-electric hybrid device that is one element constituting an opto-electric module according to an embodiment of the present invention.

FIG. 1 is a cross section view of an opto-electric hybrid device 100 that is one element constituting an opto-electric module according to an embodiment of the present invention. The opto-electric hybrid device 100 is provided with a substrate 102, a semiconductor laser 103, an optical modulator 104, a first optical waveguide 105, a second optical waveguide 106, a grating coupler 107, a driver IC 108, and an electrical interconnect 109. The electrical interconnect 109 includes a via 109a for providing electrical continuity between a first surface 100A (in FIG. 1, the upper surface) of the opto-electric hybrid device 100 and the surface of the substrate 102, and an electrical interconnect 109b formed on the surface of the substrate 102. FIG. 1 is a view of the opto-electric hybrid device 100 from the cross-sectional direction and therefore a single set of the semiconductor laser 103, the optical modulator 104, the first optical waveguide 105, the second optical waveguide 106, the grating coupler 107, and the electrical interconnect 109 is illustrated, but a plurality of sets of the semiconductor laser 103, the optical modulator 104, the first optical waveguide 105, the second optical waveguide 106, the grating coupler 107, and the electrical interconnect 109 may be arranged in the direction perpendicular to the cross section in FIG. 1. Additionally, the opto-electric hybrid device 100 may also be provided with a plurality of driver ICs 108.

The substrate 102 is a silicon (Si) substrate or a silicon on insulator (SOI) substrate, and the optical modulator 104, the first optical waveguide 105, the grating coupler 107, and the electrical interconnect 109b are formed on the surface thereof. The optical modulator 104 is optically connected to the grating coupler 107 through the first optical waveguide 105. The optical modulator 104, the first optical waveguide 105 (for example, an Si waveguide), and the grating coupler 107 can be formed on the surface of the substrate 102 using silicon photonics technology. The back surface of the substrate 102 (the surface on the opposite side from the surface on which the optical modulator 104, the first optical waveguide 105, the grating coupler 107, and the electrical interconnect 109b are formed) is a flat surface with no steps, and forms a second surface 100B of the opto-electric hybrid device 100.

Additionally, the semiconductor laser 103 and the driver IC 108 are mounted on the surface of the substrate 102. The semiconductor laser 103 is disposed near one end of the first optical waveguide 105 such that emitted light therefrom enters the first optical waveguide 105. The driver IC 108 is mounted on the substrate 102 using a connecting electrode 115 (such as a ball grid array (BGA), for example) electrically connecting an electric terminal (not illustrated) on the driver IC 108 side and the electrical interconnect 109b on the substrate 102 side to each other. The driver IC 108 is connected to the semiconductor laser 103, the optical modulator 104, and the via 109a through the electrical interconnect 109b, and is configured to drive the semiconductor laser 103 and the optical modulator 104 on the basis of an electrical signal inputted from the via 109a.

In addition, the second optical waveguide 106 is formed on the substrate 102 standing upright or obliquely with respect to the substrate 102. The inclination angle of the second optical waveguide 106 with respect to the substrate 102 is in the range from 0° to 10°, for example. The end of the second optical waveguide 106 on the substrate 102 side is positioned directly above the grating coupler 107, while the opposite end of the second optical waveguide 106 away from the substrate 102 is positioned on the first surface 100A of the opto-electric hybrid device 100.

Note that the second optical waveguide 106 erected on the substrate 102 as above can be produced by using a narrow UV light beam from above the substrate 102 to irradiate a UV-curing resin applied to have a predetermined thickness on the substrate 102, and thereby cure the UV-curing resin in a columnar shape only where the UV light beam passed through. In a configuration in which the second optical waveguide 106 is erected and formed obliquely with respect to the substrate 102, to keep unintended portions of the UV-curing resin from being cured due to oblique reflections of the UV light beam off the surface of the substrate 102, a UV absorption layer (not illustrated) for absorbing the UV light beam and suppressing reflections is preferably formed in advance on the surface of the substrate 102.

In the opto-electric hybrid device 100 configured as above, an electrical signal for operating the driver IC 108 is inputted into the via 109a through the first surface 100A of the opto-electric hybrid device 100. The driver IC 108 drives the semiconductor laser 103 and the optical modulator 104 on the basis of the electrical signal. Light emitted from the semiconductor laser 103 is modulated by the optical modulator 104 and then diffracted by the grating coupler 107 to convert the light path to a direction substantially perpendicular to the substrate 102, and the light passes through the second optical waveguide 106 and is outputted from the first surface 100A of the opto-electric hybrid device 100. In this way, electrical signals and optical signals in the opto-electric hybrid device 100 are inputted and outputted at the first surface 100A.

Figure 2:
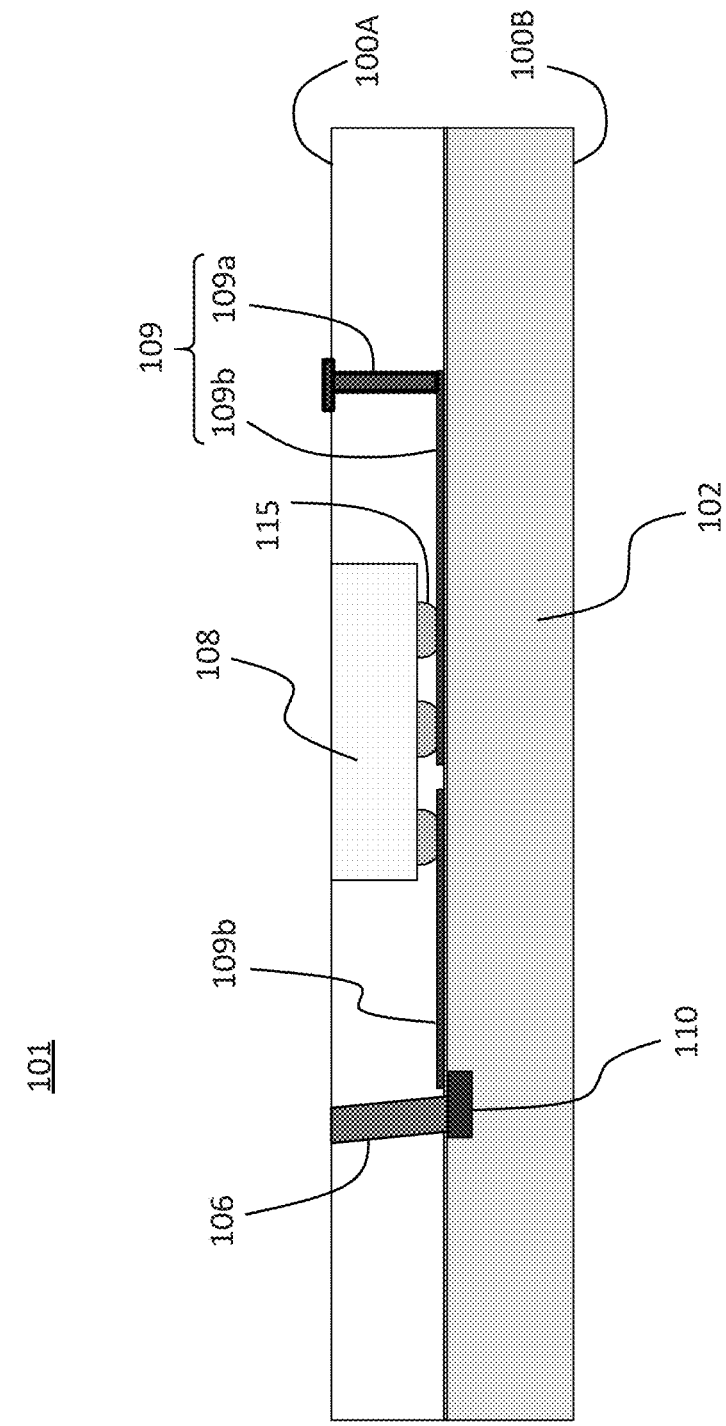
FIG. 2 is a cross section view of an opto-electric hybrid device according to another example that may be used as a structural element in an opto-electric module according to an embodiment of the present invention.

FIG. 2 is a cross section view of an opto-electric hybrid device 101 according to another example that may be used as a structural element in an opto-electric module according to an embodiment of the present invention. In FIG. 2, structural elements that are the same as the structural elements in FIG. 1 described above are denoted with the same signs. The opto-electric hybrid device 101 is provided with a light-receiving element (photodiode) 110 underneath the second optical waveguide 106 on the substrate 102 instead of the semiconductor laser 103, the optical modulator 104, the first optical waveguide 105, and the grating coupler 107 in the opto-electric hybrid device 100 of FIG. 1.

The light-receiving element 110 can be formed directly on the surface of the substrate 102 using silicon photonics technology, or chip-type light-receiving element 110 produced separately may be mounted on the substrate 102. The light-receiving element 110 is connected to the driver IC 108 through the electrical interconnect 109b. The driver IC 108 may also be a transimpedance amplifier (TIA) for performing IV (current-to-voltage) conversion of a photoelectrically converted current signal outputted from the light-receiving element 110.

In the opto-electric hybrid device 101 having the configuration of FIG. 2, an optical signal supplied from an external optical interconnect (not illustrated in FIG. 2) is inputted into the second optical waveguide 106 through the first surface 100A of the opto-electric hybrid device 100 and is incident on the light-receiving element 110. The light-receiving element 110 photoelectrically converts the optical signal to generate a current signal. The current signal is sent to the driver IC 108 through the electrical interconnect 109b, and the driver IC 108 IV-converts the current signal to generate and output a voltage signal. The electrical signal from the driver IC 108 passes through the via 109a and is outputted from the first surface 100A of the opto-electric hybrid device 100. In this way, like the opto-electric hybrid device 100 of FIG. 1, electrical signals and optical signals in the opto-electric hybrid device 101 are inputted and outputted at the first surface 100A.

Note that the configuration of an opto-electric hybrid device is not limited to the configurations illustrated in FIGS. 1 and 2. For example, an opto-electric hybrid device provided with both an optical transmission function like the opto-electric hybrid device 100 of FIG. 1 and an optical reception function like the opto-electric hybrid device 101 of FIG. 2 may be used as a structural element of an opto-electric module according to an embodiment of the present invention.

Figure 3:
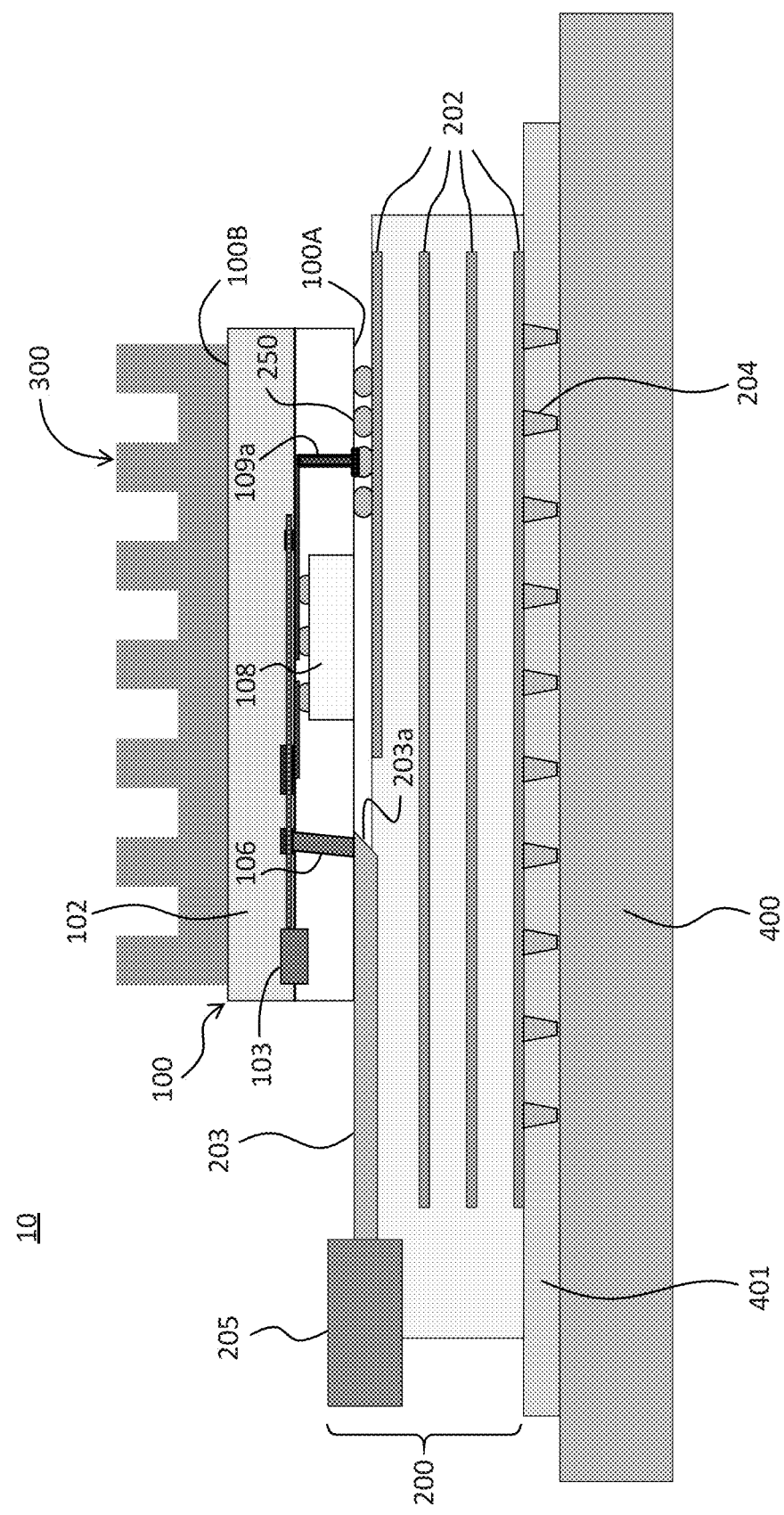
FIG. 3 is a cross section view of an opto-electric module according to an embodiment of the present invention.

FIG. 3 is a cross section view of an opto-electric module 10 according to an embodiment of the present invention. An opto-electric module 10 is provided with the opto-electric hybrid device 100 described with reference to FIG. 1, an interface substrate 200, and a heat-dissipating member 300. The opto-electric module 10 may also be provided with the opto-electric hybrid device 101 described with reference to FIG. 2 or an opto-electric hybrid device that includes optical transmission and reception functions through a combination of the configurations of both the device 100 of FIG. 1 and the device 101 of FIG. 2 instead of the opto-electric hybrid device 100 of FIG. 1. Note that the following description relates to a configuration in which the opto-electric module 10 is provided with the opto-electric hybrid device 100 of FIG. 1.

The interface substrate 200 is provided with an electrical interconnect 202, an optical interconnect 203, an electrical interface 204, and an optical interface 205. The interface substrate 200 can be configured using a rigid substrate or a flexible substrate. The electrical interconnect 202 is a single-layer or multilayer electrical interconnect, and is electrically connected to the electrical interface 204. At least a portion of the electrical interconnect 202 is exposed on the surface (the upper surface in FIG. 3) of the interface substrate 200, thereby allowing an electrical connection between the exposed portion and the opto-electric hybrid device 100. The electrical interface 204 may also be a pin grid array (PGA) for example, and by inserting the PGA into an IC socket 401 provided on a motherboard 400, the interface substrate 200 can be mechanically and electrically connected to the motherboard 400.

The optical interconnect 203 may be an optical fiber or polymer optical waveguide, and is laid out on the surface of the interface substrate 200 on the same side where the portion of the electrical interconnect 202 is exposed (that is, the upper surface in FIG. 3). An optical coupling unit 203a (described later) is formed or disposed on one end of the optical interconnect 203, and the optical interface 205 (optical connector) is connected to the other end. The optical interface 205 can be connected to a corresponding external optical connector or the like (not illustrated).

In the opto-electric module 10 of FIG. 3, the opto-electric hybrid device 100 is mounted on the interface substrate 200 with the first surface 100A facing the interface substrate 200 (flip chip mounting) side. As described above with reference to FIG. 1, one end of the via 109a and one end of the second optical waveguide 106 are positioned on the first surface 100A of the opto-electric hybrid device 100. The via 109a of the opto-electric hybrid device 100 is connected to the electrical interconnect 202 exposed on the surface of the interface substrate 200 through a connecting electrode 250 such as a BGA, for example. Additionally, the second optical waveguide 106 is optically connected to the optical interconnect 203 of the interface substrate 200 through the optical coupling unit 203a.

The optical coupling unit 203a can be configured as a total internal reflection mirror produced by forming the end face of the optical interconnect 203 (an optical fiber or polymer optical waveguide) obliquely with respect to the optical axis, for example. The reflective surface of the total internal reflection mirror 203a may be any of planar, spherical, or aspherical. The reflective surface of the total internal reflection mirror 203a preferably is spherical or aspherical because the mirror 203a thereby functions as a condensing mirror, such that light emitted from the second optical waveguide 106 of the opto-electric hybrid device 100 is condensed by the mirror 203a and coupled to the optical interconnect 203 of the interface substrate 200 with high efficiency. The optical coupling unit 203a may also be a mirror installed on the interface substrate 200 near the end of the optical interconnect 203.

As above, the opto-electric hybrid device 100 is flip-chip mounted on the interface substrate 200, and consequently the second surface 100B of the opto-electric hybrid device 100 (that is, the flat surface with no steps on the back surface of the substrate 102 forming the opto-electric hybrid device 100) faces the opposite side away from the interface substrate 200. The heat-dissipating member 300 is disposed on the second surface 100B of the opto-electric hybrid device 100. The heat-dissipating member 300 is a metal (copper or aluminum) or ceramic member (a heatsink) shaped to have a heat-dissipating surface (in FIG. 3, the upper surface) with a large surface area. The surface of the heat-dissipating member 300 near the opto-electric hybrid device 100 (in FIG. 3, the lower surface) is configured as a flat surface that closely contacts the second surface 100B of the opto-electric hybrid device 100 (that is, the flat back surface of the substrate 102). A grease or adhesive having a high thermal conductivity may also be provided between the contacting surfaces.

In the opto-electric module 10 according to the present embodiment, by causing the heat-dissipating member 300 to contact the second surface 100B of the opto-electric hybrid device 100 over a wide area (namely, the entire back surface of the substrate 102), heat generated in the electronic circuits and optical circuits (for example, the driver IC 108 and the semiconductor laser 103) and other heat-generating components inside the opto-electric hybrid device 100 is transmitted to the heat-dissipating member 300 efficiently. For this reason, a larger amount of heat from the opto-electric hybrid device 100 can be dissipated through the heat-dissipating member 300, and the cooling performance of the opto-electric module 10 can be raised.

FIG. 4 is a cross section view of an opto-electric module 11 according to another embodiment of the present invention. In FIG. 4, structural elements that are the same as the structural elements in FIG. 3 described above are denoted with the same signs. The opto-electric module 11 is provided with the opto-electric hybrid device 100 described with reference to FIG. 1, an interface substrate 201, and a heat-dissipating member 300. Like the opto-electric module 10 described above, the opto-electric module 11 may also be provided with the opto-electric hybrid device 101 described with reference to FIG. 2 or an opto-electric hybrid device that includes optical transmission and reception functions through a combination of the configurations of both the device 100 of FIG. 1 and the device 101 of FIG. 2 instead of the opto-electric hybrid device 100 of FIG. 1. Note that the following description relates to a configuration in which the opto-electric module 11 is provided with the opto-electric hybrid device 100 of FIG. 1.

The interface substrate 201 is provided with an electrical interconnect 202, an optical interconnect 203, an electrical interface 204, and an optical interface 205. Of these, the configurations of the electrical interconnect 202, the electrical interface 204, and the optical interface 205 are the same as the interface substrate 200 in FIG. 3. The optical interconnect 203 of the interface substrate 201 is embedded in the interface substrate 201. Furthermore, as illustrated in FIG. 4, the interface substrate 201 includes a hole 206, and one end of the embedded optical interconnect 203 is positioned in a side wall of the hole 206. A mirror 207 is disposed near the end of the optical interconnect 203 inside the hole 206. Also, the opto-electric hybrid device 100 is mounted on the interface substrate 201 such that the first surface 100A faces the interface substrate 201 side similarly to FIG. 3, and also such that the end of the second optical waveguide 106 is positioned over the hole 206.

For example, the mirror 207 may be a mirror obtained by mirror-polishing a metal member or a mirror obtained by forming a metal film or a dielectric multilayer film on the surface of a plastic member. The reflective surface of the mirror 207 may be any of planar, spherical, or aspherical. The reflective surface of the mirror 207 preferably is spherical or aspherical because the mirror 207 thereby functions as a condensing mirror, such that light emitted from the second optical waveguide 106 of the opto-electric hybrid device 100 is condensed by the mirror 207 and coupled to the optical interconnect 203 of the interface substrate 201 with high efficiency.

The inside of the hole 206 of the interface substrate 201 and also the space above the hole 206 and below the bottom surface of the opto-electric hybrid device 100 mounted on the interface substrate 201 are filled with a transparent medium 208 containing a solid or a gel. When the opto-electric module 11 is actually used, the opto-electric module 11 may be immersed in an inert liquid to cool the heat-generating IC and the like efficiently (immersion cooling). By filling the space from the light output unit on the opto-electric hybrid device 100 side to the light input unit on the interface substrate 201 side with the solid or gel transparent medium 208, even if the opto-electric module 11 is immersion-cooled, the inert liquid does not intrude into the space and affect the propagation of light. Consequently, the opto-electric module 11 can be immersion-cooled without degrading the optical characteristics of the opto-electric module 11.

Also, in the opto-electric module 11 according to the present embodiment, the configuration and arrangement of the opto-electric hybrid device 100 and the heat-dissipating member 300 are the same as the opto-electric module 10 of FIG. 3. Consequently, in the opto-electric module 11 according to the present embodiment, like the opto-electric module 10 of FIG. 3, by causing the heat-dissipating member 300 to contact the second surface 100B of the opto-electric hybrid device 100 over a wide area (namely, the entire back surface of the substrate 102), heat generated in the electronic circuits and optical circuits (for example, the driver IC 108 and the semiconductor laser 103) and other heat-generating components inside the opto-electric hybrid device 100 is transmitted to the heat-dissipating member 300 efficiently. For this reason, a larger amount of heat from the opto-electric hybrid device 100 can be dissipated through the heat-dissipating member 300, and the cooling performance of the opto-electric module 11 can be raised.

The above describes embodiments of the present invention, but the present invention is not limited thereto, and various modifications are possible within a scope that does not depart from the gist of the present invention.

REFERENCE SIGNS LIST 10 opto-electric module
11 opto-electric module
100 opto-electric hybrid device
101 opto-electric hybrid device
100A first surface
100B second surface
102 substrate
103 semiconductor laser
104 optical modulator
105 first optical waveguide
106 second optical waveguide
107 grating coupler
108 driver IC
109 electrical interconnect
109a via
109b electrical interconnect
110 light-receiving element
115 connecting electrode
200 interface substrate
202 electrical interconnect
203 optical interconnect
203a optical coupling unit, total internal reflection mirror
204 electrical interface
205 optical interface
206 hole
207 mirror
208 transparent medium
250 connecting electrode
300 heat-dissipating member
400 motherboard
401 IC socket

What is claimed is:

1. An opto-electric module comprising:
an opto-electric hybrid device provided with an electronic circuit and an optical circuit driven by the electronic circuit, the electronic circuit and the optical circuit positioned on one surface of a substrate, the opto-electric hybrid device having a first surface and a second surface on an opposite side from the first surface, such that an electrical input and output unit with respect to the electronic circuit and an optical input and output unit with respect to the optical circuit are disposed on the first surface and the other surface of the substrate that is on an opposite side of the one surface of the substrate provides the second surface;
an interface substrate which is disposed near the first surface of the opto-electric hybrid device and which is provided with an electrical interconnect coupled to the electrical input and output unit, an optical interconnect coupled to the optical input and output unit, an electrical interface which is connected to the electrical interconnect and also connectible to an external electrical interconnect, and an optical interface which is connected to the optical interconnect and also connectible to an external optical interconnect; and
a heat-dissipating member disposed in contact with the second surface of the opto-electric hybrid device.

2. The opto-electric module according to claim 1, wherein the second surface of the opto-electric hybrid device is a flat surface with no steps.

3. The opto-electric module according to claim 2, wherein the heat-dissipating member contacts the entirety of the flat second surface.

4. The opto-electric module according to claim 1, wherein the opto-electric hybrid device is provided with an optical waveguide disposed perpendicularly or obliquely to the first surface, and
the optical input and output unit of the opto-electric hybrid device is an end of the optical waveguide near the first surface.

5. The opto-electric module according to claim 1, further comprising:
an optical coupling unit that optically couples the optical input and output unit of the opto-electric hybrid device to the optical interconnect of the interface substrate.

6. The opto-electric module according to claim 5, wherein the optical coupling unit is a mirror formed on an end face of the optical interconnect.

7. The opto-electric module according to claim 5, wherein the optical coupling unit is a mirror built inside or mounted on the surface of the interface substrate.

8. The opto-electric module according to claim 6, wherein the mirror is a condensing mirror.

9. The opto-electric module according to claim 5, wherein the optical coupling unit includes a transparent medium of a solid or a gel filling a space between the optical input and output unit of the opto-electric hybrid device and the end face of the optical interconnect of the interface substrate.

* * * * *